United States Patent
Folch et al.

(10) Patent No.: US 11,104,802 B2
(45) Date of Patent: Aug. 31, 2021

(54) PDMS RESIN FOR STEREOLITHOGRAPHIC 3D-PRINTING OF PDMS

(71) Applicant: University of Washington, Seattle, WA (US)

(72) Inventors: Albert Folch, Seattle, WA (US); Nirveek Bhattacharjee, Seattle, WA (US); Cesar Parra, Seattle, WA (US)

(73) Assignee: University of Washington, Seattle, WA (US)

( * ) Notice: Subject to any disclaimer, the term of this patent is extended or adjusted under 35 U.S.C. 154(b) by 111 days.

(21) Appl. No.: 16/336,850

(22) PCT Filed: Sep. 26, 2017

(86) PCT No.: PCT/US2017/053526
§ 371 (c)(1),
(2) Date: Mar. 26, 2019

(87) PCT Pub. No.: WO2018/058135
PCT Pub. Date: Mar. 29, 2018

(65) Prior Publication Data
US 2020/0071525 A1    Mar. 5, 2020

Related U.S. Application Data

(60) Provisional application No. 62/399,610, filed on Sep. 26, 2016.

(51) Int. Cl.
*C08L 83/04* (2006.01)
*B29C 64/124* (2017.01)
(Continued)

(52) U.S. Cl.
CPC ............ *C08L 83/04* (2013.01); *B29C 64/124* (2017.08); *C08G 77/20* (2013.01); *C08J 3/28* (2013.01);
(Continued)

(58) Field of Classification Search
CPC ....... B29C 64/124; B33Y 10/00; B33Y 70/00; B33Y 80/00; C08G 77/04; C08G 77/20;
(Continued)

(56) References Cited

U.S. PATENT DOCUMENTS 4,590,145 A     5/1986   Itoh et al.
5,461,088 A  *  10/1995  Wolf ..................... G03F 7/0037
                                                 522/103
(Continued)

FOREIGN PATENT DOCUMENTS

WO      2016/134972 A1       9/2016
WO      2016134972 A1 †     9/2016
WO      WO-2016134972 A1 *  9/2016  ............. B33Y 10/00

OTHER PUBLICATIONS

Bhagat, A.A.S., et al., "Photodefinable Polydimethylsiloxane (PDMS) for Rapid Lab-on-a-Chip Prototyping," Lab on a Chip 7:1192-1197, 2007.

(Continued)

*Primary Examiner* — Sanza L. McClendon
(74) *Attorney, Agent, or Firm* — Christensen O'Connor Johnson Kindness PLLC

(57) ABSTRACT

Photocurable poly(siloxane) formulations for making stereolithographic 3D-printed PDMS structures, stereolithographic 3D-printing methods for making PDMS structures, and stereolithographic 3D-printed PDMS structures.

20 Claims, 11 Drawing Sheets

FIG. 1A

(51) Int. Cl.
| | |
|---|---|
| *C08G 77/20* | (2006.01) |
| *C08J 3/28* | (2006.01) |
| *C08K 5/00* | (2006.01) |
| *C08K 5/45* | (2006.01) |
| *C08K 5/5313* | (2006.01) |
| *G03F 7/00* | (2006.01) |
| *B33Y 70/00* | (2020.01) |
| *B33Y 80/00* | (2015.01) |

(52) U.S. Cl.
CPC ............... *C08K 5/005* (2013.01); *C08K 5/45* (2013.01); *C08K 5/5313* (2013.01); *G03F 7/0037* (2013.01); *B33Y 70/00* (2014.12); *B33Y 80/00* (2014.12); *C08L 2205/025* (2013.01)

(58) Field of Classification Search
CPC ........ C08G 77/26; C08G 77/28; C08G 77/38; C08G 77/382; C08G 77/392; C08G 77/42; C08G 77/44; C08J 3/28; C08K 5/005; C08K 5/45; C08K 5/5313; C08L 83/04; C08L 2205/025; G03F 7/0037; G03F 7/027; G03F 7/029; G03F 7/031; G03F 7/0757
See application file for complete search history.

(56) References Cited

U.S. PATENT DOCUMENTS

| | | | |
|---|---|---|---|
| 5,734,000 A * | 3/1998 | Popall | .............. C08G 77/06 427/387 |
| 6,174,968 B1 | 1/2001 | Hoxmeier | |
| 6,268,404 B1 † | 7/2001 | Dohler | |
| 6,517,933 B1 | 2/2003 | Soane et al. | |
| 6,737,496 B2 | 5/2004 | Hodd et al. | |
| 6,762,323 B2 | 7/2004 | Santobianco et al. | |
| 6,918,984 B2 | 7/2005 | Murray et al. | |
| 8,293,810 B2 * | 10/2012 | Ito | ................... C08L 83/08 522/148 |
| 8,822,573 B2 | 9/2014 | Kumru et al. | |
| 8,936,744 B2 | 1/2015 | Yoo et al. | |
| 2003/0088044 A1 | 5/2003 | Hodd et al. | |
| 2007/0287765 A1 † | 12/2007 | Busch | |
| 2011/0089384 A1 | 4/2011 | Lazzari et al. | |
| 2011/0236612 A1 | 9/2011 | Kumru et al. | |
| 2013/0139963 A1 | 6/2013 | Lee | |
| 2016/0075834 A1 | 3/2016 | Audenaert | |
| 2017/0369619 A1 † | 12/2017 | Doehler | |
| 2019/0161656 A1 † | 5/2019 | Pomorin | |

OTHER PUBLICATIONS

Bhattacharjee, N., et al., "Desktop-Stereolithography 3D-Printing of a Poly(dimethylsiloxane)-based Material with Sylgard-184 Properties," Advanced Materials 30(22):e1800001, May 2018. (Author Manuscript provided, available in PMC May 1, 2019, 20 pages.).
Bhattacharjee, N., et al., "The Upcoming 3D-Printing Revolution in Microfluidics," Lab on a Chip 16:1720-1742, 2016.
Choi, K.M., et al., "A Photocurable Poly(dimethylsiloxane) Chemistry Designed for Soft Lithographic Molding and Printing in the Nanometer Regime," Journal of the American Chemical Society 125:4060-4061, 2003.
Coenjarts, C.A, and C.K. Ober, "Two-Photon Three-Dimensional Microfabrication of Poly(Dimethylsiloxane) Elastomers," Chemical Materials 16:5556-5558, 2004.
Comina, G., et al., "PDMS Lab-on-a-Chip Fabrication Using 3D Printed Templates," Lab on a Chip 14:424-430, 2014.
Cong, H., and T. Pan, "Photopatternable Conductive PDMS Materials for Microfabrication," Advanced Functional Materials 18:1912-1921, 2008.

Cooksey, G.A., et al., "A Multi-Purpose Microfluidic Perfusion System With Combinatorial Choice of Inputs, Mixtures, Gradient Patterns, and Flow Rates," Lab on a Chip 9:417-426, 2009.
Desai, S.P., et al., "A Photopatternable Silicon for Biological Applications," Langmuir 24:575-581, 2008.
Dow Chemical Company, "SYLGARD™ 184 Silicone Elastomer," Technical Data Sheet, 2017, 4 pages.
Fang, N., et al., "Diffusion-Limited Photopolymerization in Scanning Micro-Stereolithography," Applied Physics A 79:1839-1842, 2004.
Gong, H., et al., "Optical Approach to Resin Formulation for 3D Printed Microfluidics," RSC Advances 5: 106621-106632I, 2015.
Gong, H., et al., "Custom 3D Printer and Resin for 18 μm x 20 μm Microfluidic Flow Channels," Lab on a Chip 17(17):2885-2996, Sep. 2017.
Hinton, T.J., et al., "3D Printing PDMS Elastomer in a Hydrophilic Support Bath via Freeform Reversible Embedding," ACS Biomaterials Science & Engineering 2:1781-1786, 2016.
Johnston, I.D., et al., "Mechanical characterization of bulk Sylgard 184 for microfluidics and microengineering," Journal of Micromechanics and Microengineering 24:035017, 2014, 7 pages.
Kitson, P.J., et al., "Configurable 3D-Printed Millifluidic and Microfluidic 'Lab on a Chip' Reactionware Devices," Lab on a Chip 12:3267-3271, 2012.
Kolesky, D.B., et al., "Three-Dimensional Bioprinting of Thick Vascularized Tissues," Proceedings of the National Academy of Sciences of the USA (PNAS) 113(12):3179-3184, Mar. 2016.
Kong, Y.L., et al., "3D Printed Quantum Dot Light-Emitting Diode," Nano Letters 14:7017-7023, 2014.
Lai, H., and A. Folch, "Design and Dynamic Characterization of 'Single-Stroke' Peristaltic PDMS Micropumps," Lab on a Chip 11:336-342, 2011.
Lee, M.P., et al., "Development of a 3D Printer Using Scanning Projection Stereolithography," Scientific Reports 5:9875, 2015, 5 pages.
Lee, J.N., et al., "Solvent Compatibility of Poly(dimethylsiloxane)-Based Microfluidic Devices," Analytical Chemistry 75:6544-6554, 2003.
Muth, J.T., et al., "Embedded 3D Printing of Strain Sensors Within Highly Stretchable Elastomers," Advanced Materials 26:6307-6312, 2014.
Patel, D.K., et al., "Highly Stretchable and UV Curable Elastomers for Digital Light Processing Based 3D Printing," Advanced Materials 29:1606000, 2017, 7 pages.
Rekštytė, S., et al., "Three-Dimensional Laser Micro-Sculpturing of Silicone: Towards Bio-Compatible Scaffolds," Optics Express 21(14):17028-17041, Jul. 2013.
Roh, S., et al., "3D Printing by Multiphase Silicone/Water Capillary Inks," Advanced Materials 29:1701554, 2017, 7 pages.
Sinkala, E., and D.T. Eddington, "Oxygen Sensitive Microwells," Lab on a Chip 10:3291-3295, 2010.
Sun, C., et al., "Projection Micro-Stereolithography Using Digital Micro-Mirror Dynamic Mask," Sensors and Actuators A 121:113-120, 2005.
Tan, J.L., et al., "Cells Lying on a Bed of Microneedles: An Approach to Isolate Mechanical Force," Proceedings of the National Academy of Sciences of the USA (PNAS) 100(4):1484-1489, Feb. 2003.
Thorsen, T., et al., "Microfluidic Large-Scale Integration," Science 298:580-584, Oct. 2002.
Thrasher, C.J., et al., "Modular Elastomer Photoresins for Digital Light Processing Additive Manufacturing," ACS Applied Materials & Interfaces 9:39708-39716, 2017.
Urrios, A., et al., "3D-Printing of Transparent Bio-Microfluidic Devices in PEG-DA," Lab on a Chip 16:2287-2294, 2016.
Whitesides, G.M., "The Origins and the Future of Microlluidics," Nature 442:368-373, Jul. 2006.
Xia, Y., and G.M. Whitesides, "Soft Lithography," Annual Review of Materials Science 28(1):153-184, 1998.
Bhattacharjee, N., et al., "A Biocompatible PDMS Resin for 3D-Printing of Biomedical Microdevices," 2 pages.

(56) References Cited

OTHER PUBLICATIONS

International Search Report and Written Opinion dated Jan. 18, 2018, issued in corresponding International Application No. PCT/US2017/053526, filed Sep. 26, 2017, 17 pages.

\* cited by examiner
† cited by third party

PDMS RESIN FOR STEREOLITHOGRAPHIC 3D-PRINTING OF PDMS

CROSS-REFERENCE TO RELATED APPLICATION

This application claims the benefit of U.S. Application No. 62/399,610, filed Sep. 26, 2016, expressly incorporated herein by reference in its entirety.

STATEMENT OF GOVERNMENT LICENSE RIGHTS

This invention was made with Government support under Grant No. RO1CA181445 awarded by the National Institutes of Health. The Government has certain rights in the invention.

BACKGROUND OF THE INVENTION

Microfluidics has had a great impact in a broad range of areas, from biological analysis and basic cell biology to chemical synthesis or optics. Microfluidic systems are usually built by replica-molding and bonding in elastomers such as poly(dimethylsiloxane) (PDMS) or in thermoplastics such as poly(ethyl-methacrylate) (PMMA) or polystyrene (PS). These polymers owe their success to four key properties: biocompatibility, transparency, low cost, and being copyright-free. PDMS, in addition, is also elastomeric—a property that is key for producing fluidic automation components—and gas-permeable—a key factor for allowing $O_2$ and $CO_2$ exchange in cell culture applications. Although applications are not lacking and PDMS molding is able to produce micron-resolution features, PDMS mold fabrication requires a lengthy manual procedure. Furthermore, complex devices need to be fabricated by layering, which severely restricts the possible 3D geometries. Additionally, in order to be cost-effective, molded devices have to be produced in large numbers, require huge initial capital investments, and they cannot be customized in short time frames. An alternative rapid plastic fabrication method allowing for more complex geometries and multi-height structures that are not limited to layers is micromilling; however, micromilling still requires assembly and bonding in order to produce closed channels, and the milling tool cannot cut arbitrary shapes.

Stereolithography (SL) is a form of 3D printing invented in the 1980s that allows for the assembly-free production of quasi-arbitrary 3D shapes in a single polymeric material from a photosensitive resin precursor by means of a focused laser or a digital light projector (DLP). SL has recently attracted attention as a way to custom-fabricate complex microfluidic systems for research and development due to its automated 3D fabrication, rapidly decreasing costs, and improving resolution. However, available SL resins do not have all the favorable physicochemical properties of the above-named polymers (e.g., biocompatibility, transparency, elasticity, and gas permeability). For cell culture studies, optical transparency and biocompatibility are two major drawbacks that SL has to overcome. Some commercial SL resins are considered clear (e.g., WaterShed, Form Labs Clear or VisijetCrystal) and only after a finishing step they became reasonably transparent. One resin that is nearly colorless and meets biocompatibility standards is the WaterShed XC11122 by DSM Somos. WaterShed becomes yellow under prolonged exposure to ambient light. Moreover, a recent systematic investigation has shown that many of the popular 3D-printing resins (including Visijet Crystal or WaterShed) release toxic leachates that inhibit growth of cells from different vertebrate and invertebrate indicator organisms. Zebrafish embryos cultured on these resins showed developmental defects. Finding out which components of commercial resins are responsible for the cytotoxicity and the transparency loss is very difficult because the resins have a proprietary formulation. As a result, the performance of SL-printed devices remains inferior to that of equivalent PDMS devices.

Despite the advances in SL 3D-printing methods and structures noted above, a need exists to improve SL 3D-printing methods to provide PDMS SL 3D-printed structures. The present invention seeks to fulfill this need and provides further related advantages.

SUMMARY OF THE INVENTION

The present invention provides photocurable poly(siloxane) formulations for making stereolithographic (SL) 3D-printed PDMS structures, SL 3D-printing methods for making PDMS structures, and SL 3D-printed PDMS structures made from the formulations and methods.

In one aspect, the invention provides photocurable poly (siloxane) formulations for making stereolithographic 3D-printed PDMS structures.

In one embodiment, the invention provides a poly(siloxane) formulation, comprising:

(a) a first polymerizable poly(siloxane) having a first terminus and a second terminus, each terminus comprising a terminal polymerizable group;

(b) a second polymerizable poly(siloxane) comprising repeating units, at least some of the repeating units having a side-chain polymerizable group; and (c) a photo-initiator.

In another embodiment, the invention provides a poly (siloxane) formulation, comprising:

(a) a first polymerizable poly(siloxane) having a first terminus and a second terminus, each terminus comprising a terminal polymerizable group;

(b) a second polymerizable poly(siloxane) comprising repeating units, at least some of the repeating units having a side-chain polymerizable group; and (c) a photo-initiator; and (d) a photo-sensitizer.

In a further embodiment, the invention provides a poly (siloxane) formulation, comprising:

(a) a first polymerizable poly(siloxane) having a first terminus and a second terminus, each terminus comprises a terminal polymerizable group;

(b) a second polymerizable poly(siloxane) comprising repeating units, at least some of the repeating units having a side-chain polymerizable group; and (c) a photo-initiator;

(d) a photo-sensitizer; and (e) an ultraviolet light absorber.

In yet another embodiment, the invention provides a poly(siloxane) formulation, comprising:

(a) polymerizable poly(siloxane) comprising repeating units, at least some of the repeating units having a side-chain polymerizable group; and (b) a photo-initiator.

In another aspect, the invention provides stereolithographic 3D-printing methods for making PDMS structures. In one embodiment, the method for stereolithographic 3-D printing an object, comprises:

(a) distributing a poly(siloxane) formulation of the invention in a vessel having an XY surface to provide a resin contained in the vessel, wherein the resin is coextensive with the surface;

(b) positioning a build-surface on which the object is to be printed at a distance Z from the bottom of the vessel;

(c) selectively illuminating a first portion of the resin through positioning of a light source relative to the build-surface to effect photopolymerization of the first portion of the resin to provide a first photocured layer adjacent to the surface, wherein the first photocured layer has a thickness defined by the distance between the build-surface and the bottom of the vessel;

(d) adjusting the relative position of the build-surface and the light source and selectively illuminate a second portion of the resin adjacent to the first photocured layer to provide a second photocured layer, wherein the first and second photocured layers form an integral photocured layer; and (e) repeating steps (c) and (d) until the object is built.

In a further aspect, the invention provides stereolithographic 3D-printed PDMS structures. The stereolithographically 3D-printed PDMS structures of the invention include the photocurable poly(siloxane) formulations of the invention that has been photocured (i.e., photocured version of the photocurable poly(siloxane) formulations.

In one embodiment, the stereolithographically 3D-printed PDMS structures of the invention include a poly(siloxane) network prepared by copolymerization of:

(a) a first polymerizable poly(siloxane) having a first terminus and a second terminus, each terminus comprises a terminal polymerizable group; and (b) a second polymerizable poly(siloxane) comprising repeating units, at least some of the repeating units having a side-chain polymerizable group.

DESCRIPTION OF THE DRAWINGS

The foregoing aspects and many of the attendant advantages of this invention will become more readily appreciated as the same become better understood by reference to the following detailed description, when taken in conjunction with the accompanying drawings.

FIG. 6B is a drawing of the representative 3D-printed co-planar microfluidic device shown in FIG. 6A depicting channel dimensions.

DETAILED DESCRIPTION OF THE INVENTION

Figure 1A:
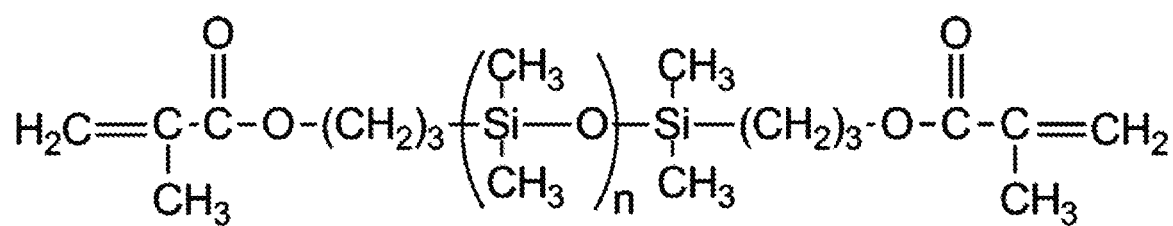
FIGS. 1A-1E relate to a representative resin composition of the invention: representative first polysiloxane (end-terminated methacrylated polysiloxane), methacryloxypropyl dimethylsiloxane) (1A); representative second polysiloxane (side-chain methacrylated polysiloxane), 2-4% methacryloxypropyl dimethylsiloxane) (1B); representative photo-initiator, (2,4,6-trimethylbenzoyl) phenyl phosphinate, TPO-L (1C); representative photo-sensitizer, isopropyl thioxanthone, ITX (1D); absorption spectra of TPO-L, ITX and the UV LED emission spectra (1E).

The present invention provides photocurable poly(siloxane) formulations for making stereolithographic (SL) 3D-printed PDMS structures, SL 3D-printing methods for making PDMS structures, and SL 3D-printed PDMS structures made from the formulations and methods.

Poly(dimethyl siloxane) (PDMS) is a transparent, elastomeric, biocompatible, gas-permeable and water impermeable material traditionally used for soft lithography. However, soft lithography is labor intensive and requires assembly of 2D layers, which limits the complexity of the 3D structures that can be created. 3D printing, in contrast, is a family of automated, digital, assembly-free manufacturing techniques that are increasingly being used for fabricating microdevices because of their low-cost and design efficiency. As described herein, in one aspect the invention provides a photocurable PDMS resin, which has the advantageous physicochemical and mechanical properties of thermally-cured PDMS and can be 3D-printed using stereolithography (SL) to build microdevices.

The progress made in the development of microfluidic technology can largely be attributed to the attractive properties of PDMS, the material typically used in soft lithography for prototyping biomedical microdevices. Soft lithography consists of micro-molding and careful assembly of 2D layers, which is laborious and complicated especially for complex 3D designs. Stereolithography, on the other hand, being an entirely digital, automated and assembly-free process, is gaining in popularity as a manufacturing method for microfluidics. As described herein, in one aspect the invention provides a PDMS resin for 3D-printing microfluidic devices, which is UV-curable and retains the attractive properties of thermally-cured PDMS.

Photocurable Poly(Siloxane) Formulations for Making Stereolithographic 3D-Printed PDMS Structures In one aspect, the invention provides photocurable poly(siloxane) formulations for making stereolithographic 3D-printed PDMS structures.

In one embodiment, the invention provides a poly(siloxane) formulation, comprising:
 (a) a first polymerizable poly(siloxane) having a first terminus and a second terminus, each terminus comprising a terminal polymerizable group;
 (b) a second polymerizable poly(siloxane) comprising repeating units, at least some of the repeating units having a side-chain polymerizable group; and
 (c) a photo-initiator.

In another embodiment, the invention provides a poly(siloxane) formulation, comprising:
 (a) a first polymerizable poly(siloxane) having a first terminus and a second terminus, each terminus comprising a terminal polymerizable group;
 (b) a second polymerizable poly(siloxane) comprising repeating units, at least some of the repeating units having a side-chain polymerizable group; and
 (c) a photo-initiator; and
 (d) a photo-sensitizer.

In a further embodiment, the invention provides a poly(siloxane) formulation, comprising:
 (a) a first polymerizable poly(siloxane) having a first terminus and a second terminus, each terminus comprises a terminal polymerizable group;
 (b) a second polymerizable poly(siloxane) comprising repeating units, at least some of the repeating units having a side-chain polymerizable group; and
 (c) a photo-initiator;
 (d) a photo-sensitizer; and
 (e) an ultraviolet light absorber.

In yet another embodiment, the invention provides a poly(siloxane) formulation, comprising:
 (a) polymerizable poly(siloxane) comprising repeating units, at least some of the repeating units having a side-chain polymerizable group; and
 (b) a photo-initiator.

Stereolithographic 3D-printed PDMS structures of the invention (e.g., that are transparent and elastomeric) can be made from two components: a polymerizable poly(siloxane) comprising repeating units, at least some of the repeating units having a side-chain polymerizable group and a photo-initiator.

Figure 2A:
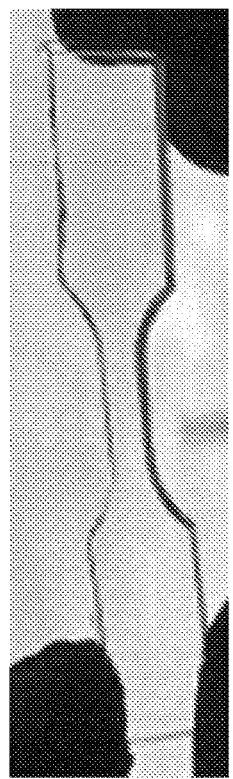
FIG. 2A is a series of images that shows the flexibility (bending) of a 3D-printed PDMS object made in accordance with a representative method of the invention (E:S ratio=11:1, 0.25% TPO-L).
Figure 2A:
Figure 2A:
Figure 2C:
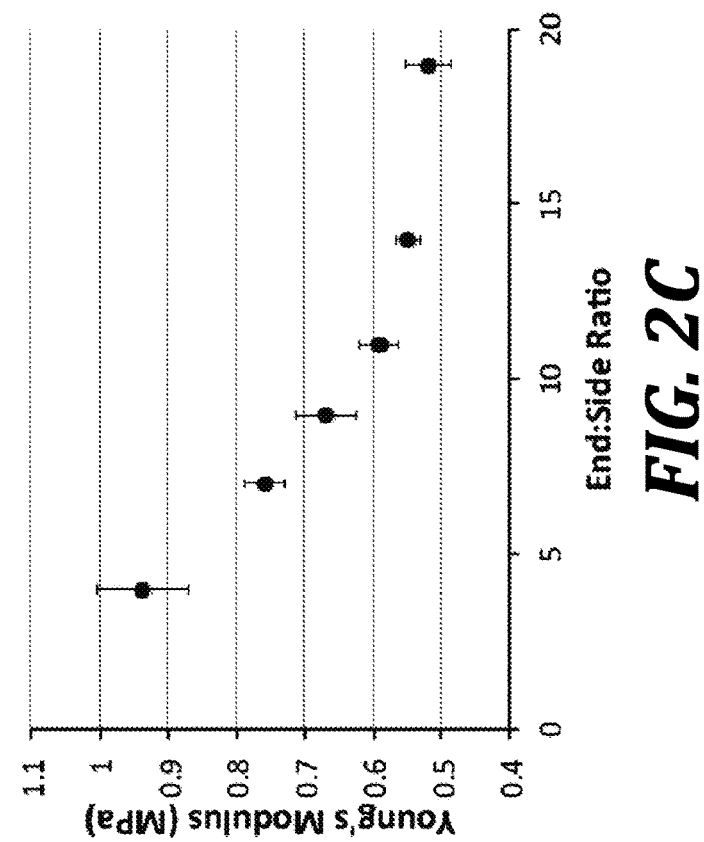
FIG. 2C illustrates Young's modulus (MPa) as a function of End:Side (E:S) ratio [first polysiloxane (end terminal methacrylated polysiloxane): second polysiloxane (side-chain methacrylated polysiloxane)] for a representative 3D-printed structure made in accordance with a representative method of the invention.
Figure 2B:
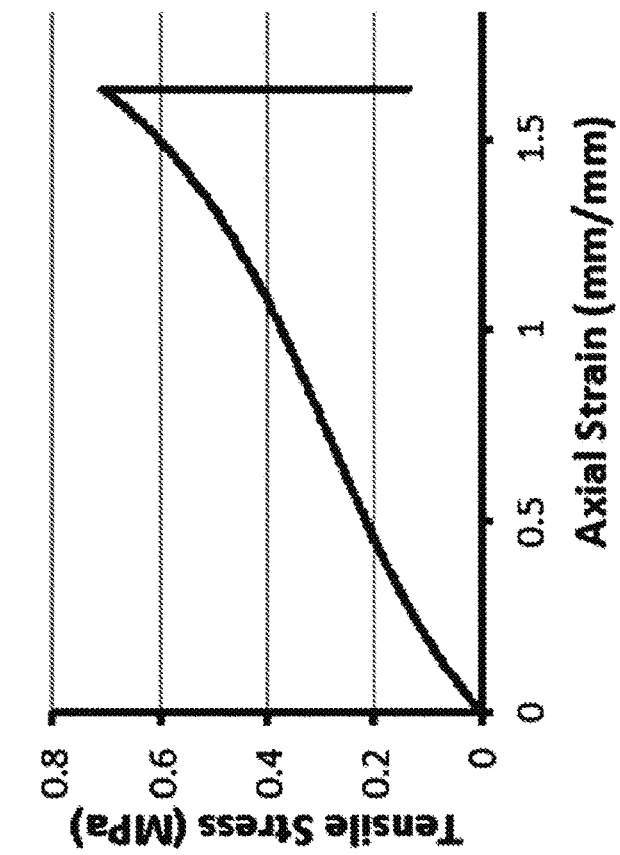
FIG. 2B is a plot of tensile stress (MPa) as a function of axial strain (mm/mm); a typical axial stress-strain curve depicting hyper-elasticity—increase in Young's modulus as strain increases—made in accordance with a representative method of the invention.
Figure 2D:
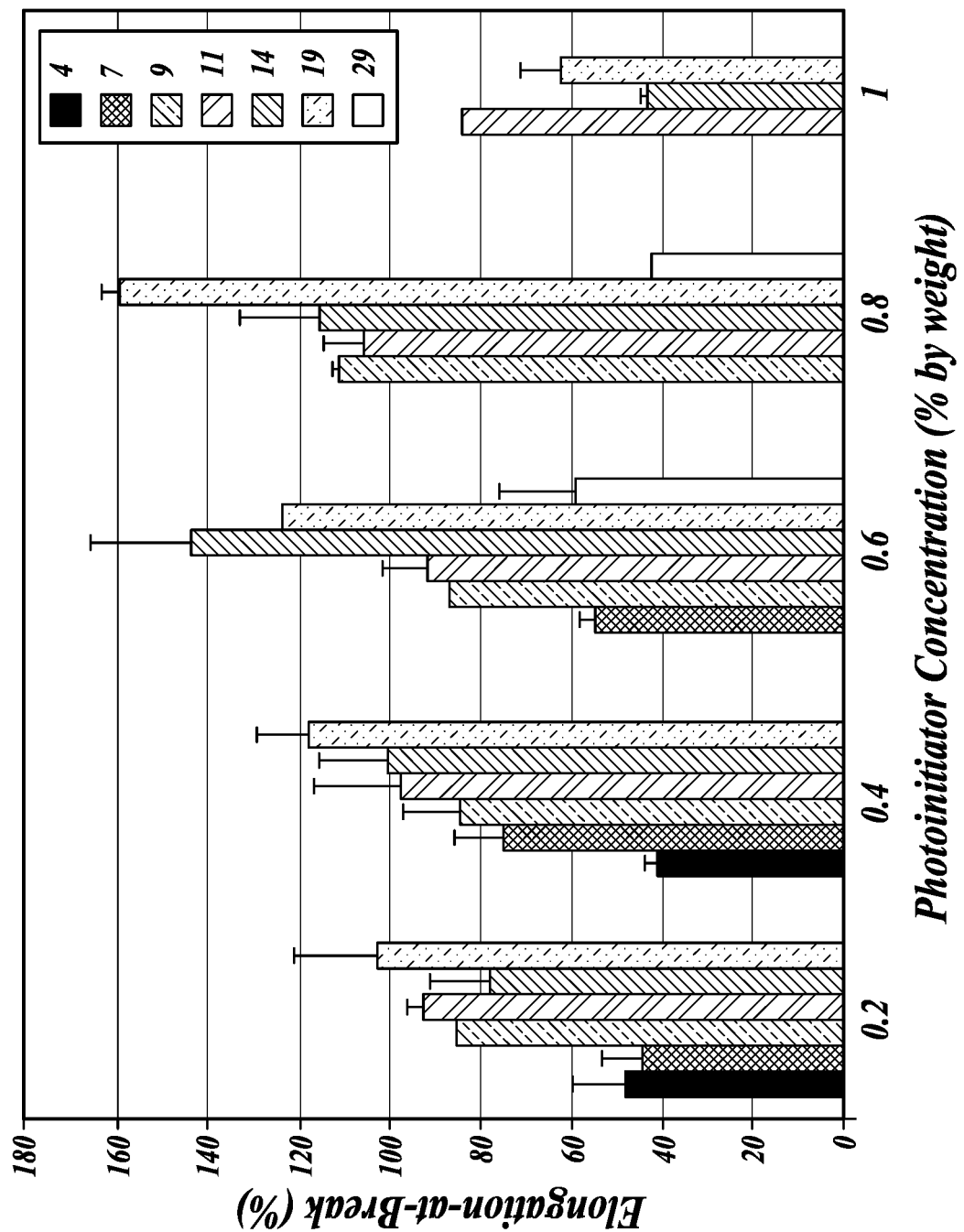
FIG. 2D illustrates Elongation-at-Break (%) as a function of photoinitiator concentration (% by weight) for different E:S ratios (4, 7, 9, 11, 14, 19, and 29).

However, because a goal is to print an elastomeric structure with advantageous mechanical properties that are similar to the thermally cured Sylgard 184 (standard material used in microfluidics), the 3D-printed structure preferably has a low Young's modulus on the order of 0.5-1 MPa and an elongation-at-break of about 140%. In certain embodiments noted above, polymerization through (i.e., crosslinking between) the end-terminated reactive (e.g., polymerizable) groups of the first poly(siloxane) and the side-chain reactive (e.g., polymerizable) groups of the second poly(siloxane) provides a networked structure that is important for enhancing elasticity. By having different ratios of end-terminal and side-chain reactive (e.g., polymerizable) groups (E:S), the elasticity of the printed or photopolymerized elastomer can be tuned. Referring to FIG. 2C, in certain embodiments, for Young's modulus less than about 1.0, E:S is greater than about 3 (e.g., 3-20); for Young's modulus between about 0.8 and about 0.6, E:S is from about 5 to about 10; and for Young's modulus about 0.5, E:S is from about 10 to about 20. Elongation-at-break as a function of E:S (and photo-initiator concentration) is shown in FIG. 2D. In certain embodiments, advantageous elongation-at-break is achieved at E:S from about 10 to about 20.

In certain embodiments, the poly(siloxane) of the formulation is a poly(dimethylsiloxane).

In certain embodiments, the first polymerizable poly(siloxane) is a poly(dimethylsiloxane).

For the first polymerizable poly(siloxane), the terminal polymerizable group is reactive toward free radical polymerization. Suitable terminal polymerizable groups are independently selected from acrylate (—OC(=O)CH=CH$_2$), methacrylate (—OC(=O)C(CH$_3$)=CH$_2$), acrylamide (—NHC(=O)CH=CH$_2$), and vinyl (—CH=CH$_2$) groups. In one embodiment, the first polymerizable poly(siloxane) is a methacryloxypropyl poly(dimethylsiloxane).

In certain embodiments, the second polymerizable poly(siloxane) is a poly(dimethylsiloxane).

For the second polymerizable poly(siloxane), the side-chain polymerizable group is reactive toward free radical polymerization. Suitable side-chain polymerizable groups are independently selected from acrylate (—OC(=O)CH=CH$_2$), methacrylate (—OC(=O)C(CH$_3$)=CH$_2$), acrylamide (—NHC(=O)CH=CH$_2$), and thiol (—SH) groups.

The terminal and side-chain polymerizable groups may be the same or different.

In one embodiment, the second polymerizable poly(siloxane) is a copolymer of dimethyl siloxane and methacryloxypropyl dimethyl siloxane. In certain of these embodiments, the second polymerizable poly(siloxane) is a copolymer of dimethyl siloxane and methacryloxypropyl dimethyl siloxane, wherein the copolymer comprises from about 1 to about 10% by weight methacryloxypropyl dimethyl siloxane in PDMS with a total molecular weight in the range of about 20 to about 60 kDa. In certain embodiments, the copolymer comprises from about 4 to about 6% by weight methacryloxypropyl dimethylsiloxane in PDMS with a total molecular weight of about 57 kDa. In other embodiments, the copolymer comprises from about 2 to about 4% by weight methacryloxypropyl dimethylsiloxane in PDMS with a total molecular weight of about 25 kDa. In further embodiments, the copolymer comprises from about 7 to about 9% by weight methacryloxypropyl dimethylsiloxane in PDMS with a total molecular weight of about 38 kDa.

In certain embodiments, the first polymerizable poly(siloxane) has a molecular weight from about 10 kDa to about 60 kDa.

Figure 1B:
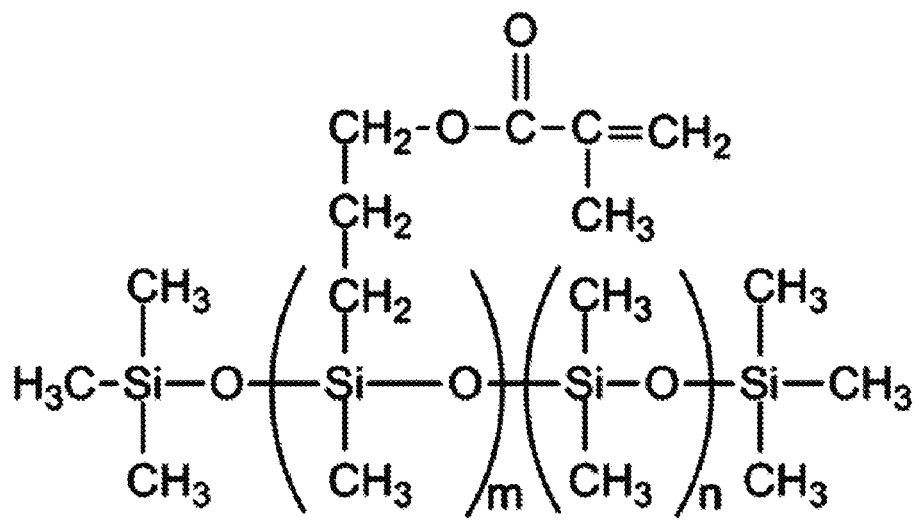
Figure 1C:
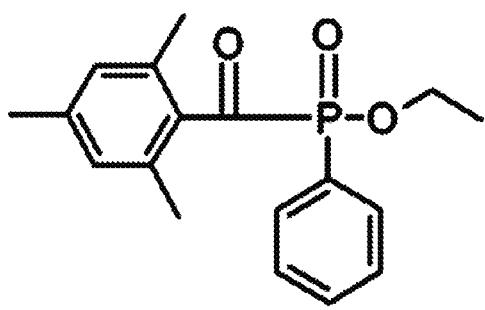
Figure 1D:
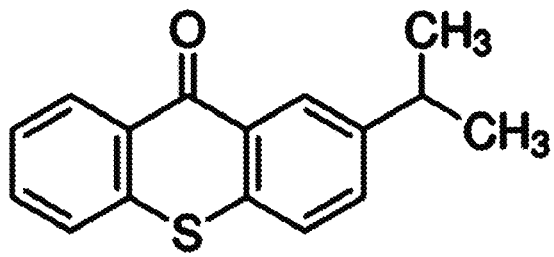

It will be appreciated that values for m and n (integers) in the chemical structures shown in FIGS. 1A and 1B are consistent with the molecular weight ranges described herein.

The photocurable formulations of the invention include a photo-initiator and optionally include a photo-sensitizer. In the practice of the invention, the photo-initiator absorbs light directly from the light source used for photopolymerization to produce the SL 3D-printed PDMS structures or absorbs energy from the photo-sensitizer, which absorbs light from the light source, to initiate photopolymerization of the poly(siloxanes) via their polymerizable groups. The photo-initiators and photo-sensitizers useful in the formulations of the invention are selected depending on the wavelength of the light source used for photopolymerization to produce the SL 3D-printed PDMS structures. The standard DLP stereolithography printers come with 385 nm or 405 nm UV LED sources.

For embodiments that do not include a photo-sensitizer, the photo-initiator has an absorbance that overlaps with the light emanating from the light source. For embodiments that do include a photo-sensitizer, the photo-sensitizer has an absorbance that overlaps with the light emanating from the light source and has an absorbance that overlaps with the photo-initiator.

In certain embodiments, the photo-initiator has an absorbance in the range from about 375 to about 425 nm. In certain embodiments, the photo-initiator is a Type I photo-initiator. Suitable Type I photo-initiators include benzoyl and acyl phosphine oxide derivatives that are soluble in PDMS. In certain embodiments, the photo-initiator is a Type I radical photo-initiator and/or Type II photo-sensitizer along with a co-initiator/synergist (typically a tertiary amine). In one embodiment, the photo-initiator is ethyl (2,4,6-trimethylbenzoyl) phenyl phosphinate (TPO-L).

In certain embodiments, the photo-sensitizer has an absorbance in the range from about 375 nm to about 425 nm. In one embodiment, the photo-sensitizer has an absorbance of about 385 nm. In certain embodiments, the photo-sensitizer is a Type II photosensitizer. Suitable photo-sensitizers include thioxanthone compounds and benzophenone compounds. Representative useful thioxanthone compounds include isopropylthioxanthone and 2-chloro-thioxanthone. Representative useful benzophenone compounds include 4,4'-bis(dimethylamino)benzophenone (Michler's ketone), 4,4'-bis(diethylamino)benzophenone, and 4-dimethylamino-benzophenone.

In certain embodiments, the photo-initiator is ethyl (2,4,6-trimethylbenzoyl) phenyl phosphinate (TPO-L) and the photo-sensitizer is isopropyl thioxanthone (ITX).

In certain embodiments, when the photo-sensitizer is a Type II photosensitizer, the formulation further includes a co-initiator. Suitable co-initiators include tertiary amines and acrylated tertiary amines, which may be optionally incorporated into the poly(siloxane). Representative tertiary amines include triethylamine, triethanolamine, N-methyl-diethanolamine, and ethyl 4-(dimethylamino)benzoate. Representative acrylated tertiary amines include 2-(diethylamino)ethyl acrylate, 2-(diethylamino)ethyl methacrylate, 2-(dimethylamino)ethyl acrylate, and 2-(dimethylamino)ethyl methacrylate.

In certain embodiments, the poly(siloxane) formulations of the invention include an ultraviolet light absorber. Suitable ultraviolet light absorbers do not change the intrinsic properties of the 3D-printed material. Suitable ultraviolet light absorbers assist in improving the resolution of printing, specifically the z-resolution of printing overhanging structures (in particular for microfluidics, the roof over microchannels). Suitable ultraviolet light absorbers have an absorbance in the range from about 300 nm to about 420 nm (UV-A range). Representative ultraviolet light absorbers include hydroxyphenyl-s-triazine compounds, hydroxyphenyl benzotriazol compounds, and cyano-acrylate compounds.

Stereolithographic 3D-Printing Methods for Making PDMS Structures

In another aspect, the invention provides stereolithographic 3D-printing methods for making PDMS structures. In one embodiment, the method for stereolithographic 3-D printing an object, comprises:

(a) distributing a poly(siloxane) formulation of the invention in a vessel having an XY surface to provide a resin contained in the vessel, wherein the resin is coextensive with the surface;

(b) positioning a build-surface on which the object is to be printed at a distance Z from the bottom of the vessel;

(c) selectively illuminating a first portion of the resin through positioning of a light source relative to the build-surface to effect photopolymerization of the first portion of the resin to provide a first photocured layer adjacent to the surface, wherein the first photocured layer has a thickness defined by the distance between the build-surface and the bottom of the vessel;

(d) adjusting the relative position of the build-surface and the light source and selectively illuminate a second portion of the resin adjacent to the first photocured layer to provide a second photocured layer, wherein the first and second photocured layers form an integral photocured layer; and (e) repeating steps (c) and (d) until the object is built.

The method of the invention provides for an improved method for stereolithographic 3-D printing an object from a photocurable resin, where the improvement is the use of a photocurable poly(siloxane) formulation of the invention as the photocurable resin.

In the methods of the invention, the methods preferably further include washing the built object (or extracting the built object) to remove uncured resin (e.g., poly(siloxanes), photo-initiator, photo-sensitizer, and ultraviolet light absorber) that is residual in the built object. In these methods, washing (or extracting) the built object to remove uncured resin reveals voids in the built object that result from select illumination and photopolymerization. In these methods, washing (or extracting) the built object includes serial washing (or extracting) with solvents with increasing polarity.

The washing/extracting/rinsing of the uncured resin resident in the built object is an important step when making any 3D-printed structure. The washing/extracting/rinsing steps are even more important when making microfluidic structures or structures where uncured resin needs to be removed from internal voids. Solvents like xylenes, hexane, methylisobutyl ketone, and volatile dimethyl siloxanes can be used to dissolve the uncured resin and facilitate its removal from the built object. Alcohols, such as isopropyl alcohol, can be used to wash away (rinse off) the solvents. The solvents that dissolve uncured PDMS also swell the 3D-printed PDMS objects, and therefore sequential dilution or removal of the organic solvent is very important in order to ensure that stresses are not developed during the de-swelling process. These stresses can otherwise break the printed objects. Therefore serial washing/extraction using solvents with decreasing solubility in PDMS is a preferred way of clearing internal voids in 3D-printed PDMS structures.

The object formed in accordance with the methods of the invention can be a solid object or an object that include voids (e.g., coplanar (XY) channels, as well as complex 3D-channels interconnecting in the object's Z-direction). Suitable objects include structures that can be designed using any 3D-CAD software and then 3D-printed.

The methods of the invention provide biocompatible SL 3D-printed PDMS structures. These structures permit the growth and culture of mammalian primary cells. Ensuring biocompatibility requires removal of uncured oligomers, residual photo-initiator, photosensitizer, or UV absorber molecules that are not integrated to the polymer matrix. As noted above, this is achieved by serial extraction (washing) using organic solvents for different periods of time.

Stereolithographic 3D-Printed PDMS Structures

In a further aspect, the invention provides stereolithographic 3D-printed PDMS structures. The stereolithographically 3D-printed PDMS structures of the invention include the photocurable poly(siloxane) formulations of the invention that has been photocured (i.e., photocured version of the photocurable poly(siloxane) formulations.

In one embodiment, the stereolithographically 3D-printed PDMS structures of the invention include a poly(siloxane) network prepared by copolymerization of:

(a) a first polymerizable poly(siloxane) having a first terminus and a second terminus, each terminus comprises a terminal polymerizable group; and (b) a second polymerizable poly(siloxane) comprising repeating units, at least some of the repeating units having a side-chain polymerizable group.

Suitable objects include structures that can be designed using any 3D-CAD software and then 3D-printed.

In certain embodiments, the SL 3D-printed PDMS object is a microfluidic device. As used herein, the term "microfluidic device" is a fluidic device that includes a feature (e.g., flow channel, port, flow intersection, valve) that is related to the fluidic properties (e.g., laminar flow) of the device, having a micro-dimension (e.g., less than about 1.0 mm). However, depending on design and use (e.g., liquids flowing through the device), the feature may have a dimension greater than 1.0 mm. Conventionally, microfluidic devices have at least one dimension of a channel in the device that is in the range of a micrometer or tens of micrometers.

Representative SL 3D-printed PDMS structures include biocompatible SL 3D-printed PDMS structures that permit the growth and culture of mammalian primary cells.

Representative SL 3D-printed PDMS structures include SL 3D-printed PDMS structures having advantageous mechanical properties, such as structures have Young's modulus from about 0.5 to about 1 MPa and elongation-to-break from about 60 to about 180%.

In addition to structures that are biocompatible and/or have advantageous mechanical properties, representative SL 3D-printed PDMS structures include SL 3D-printed PDMS structures that are optically transparent.

The following is a description of stereolithographic 3D-printed PDMS structures formed in accordance with representative methods of the invention.

Photocurable PDMS Formulation. A representative PDMS formulation (resin) was prepared by mixing two kinds of silicone methacrylate monomers—a copolymer of dimethylsiloxane and methacryloxypropyl siloxane (2-4% methacryloxypropyl siloxane) and an end-terminated methacryloxypropyl poly(dimethyl siloxane), with a photo-initiator, ethyl (2,4,6-trimethylbenzoyl) phenyl phosphinate (TPO-L), and a photo-sensitizer, isopropyl thioxanthone (ITX) (See FIGS. 1A-1D for chemical structures of representative polysiloxanes, photo-initiator, and photo-sensitizer).

Figure 1E:
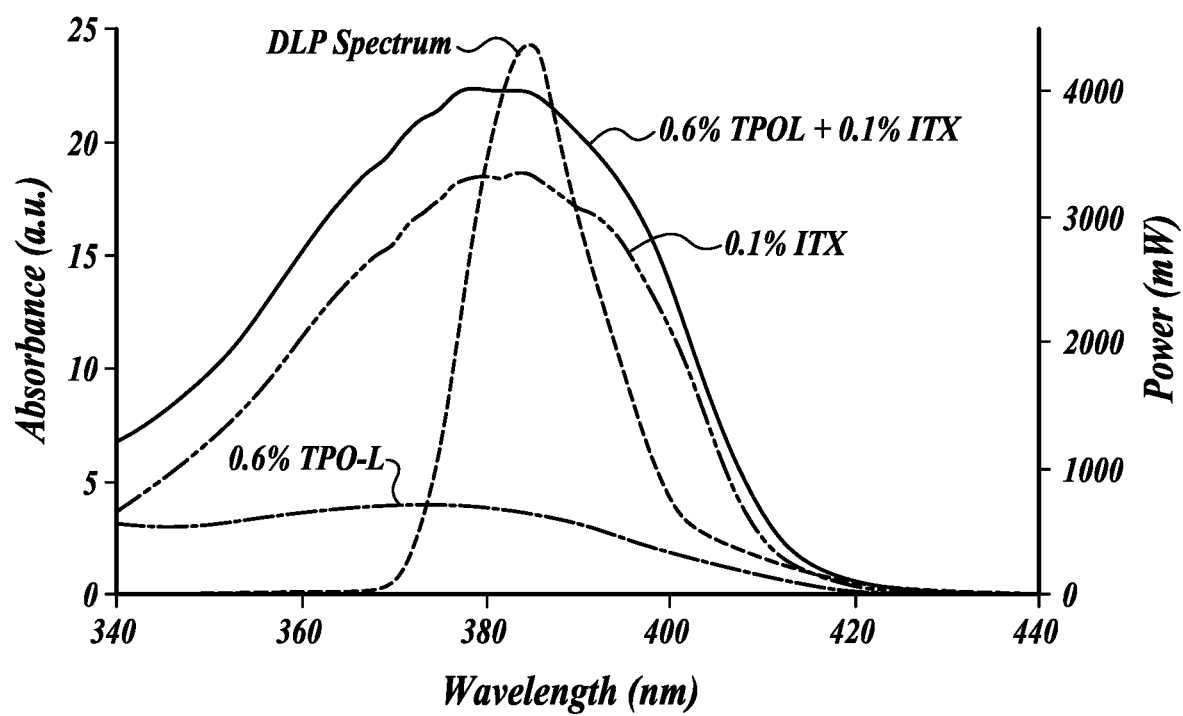

All SL printing was done with an Ilios HD printer, equipped with a 385 nm UV LED DLP projector. TPO-L has a high absorbance at 385 nm and is soluble in silicone. According to the Beer-Lambert law, the strong absorption of ITX at 385 nm (FIG. 1E) limits the penetration of the projected UV light into the resin, and therefore enables higher z-resolution.

Figure 3A:
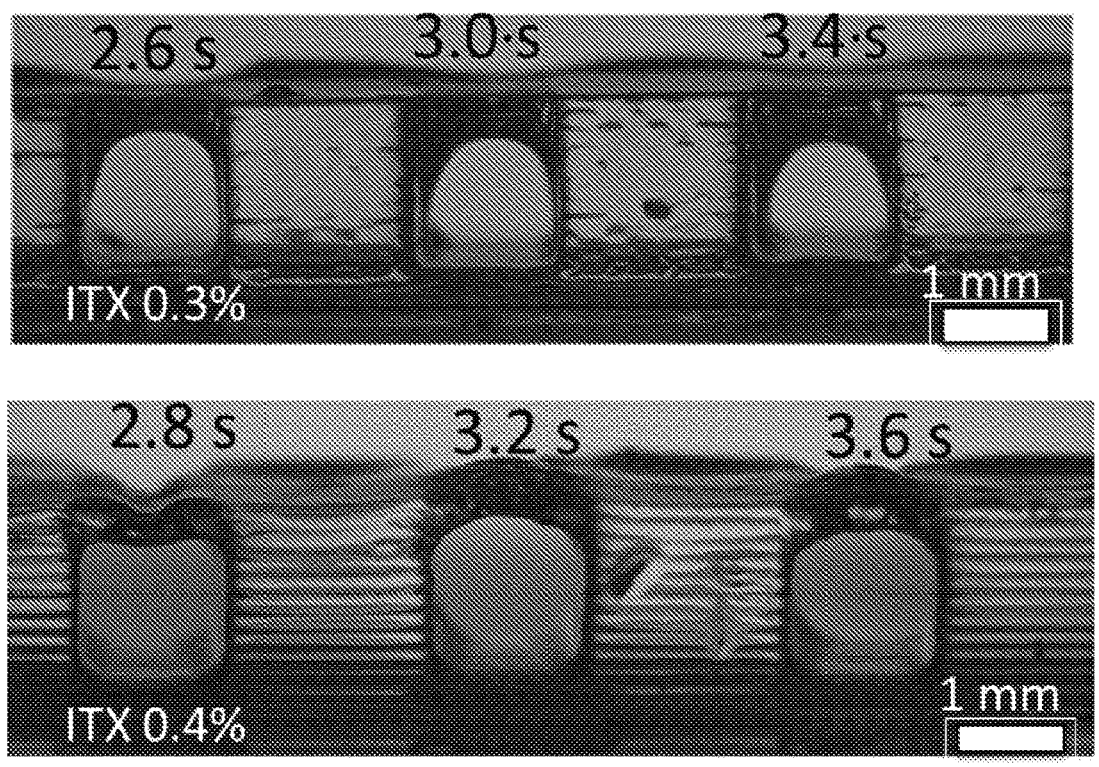
FIGS. 3A and 3B illustrates Z-depth resolution of 3D-printed structure made in accordance with representative methods of the invention: 3D-printed roofs over voids with 0.6% TPO-L and 0.3% ITX (top) and 0.4% ITX (bottom) (the voids between the side walls and underneath the roof are cleared of uncured resin after 3D-printing) (3A); plot of the thickness (Z-depth, mm) of 3D-printed PDMS roofs as a function of exposure time(s) when using 0.6% TPO-L and various ITX concentration (0.05, 0.10, 0,20, 0.30, 0.40%) (3B). As ITX concentration is increased, z-resolution increases (thinner roofs can be made).
Figure 3B:
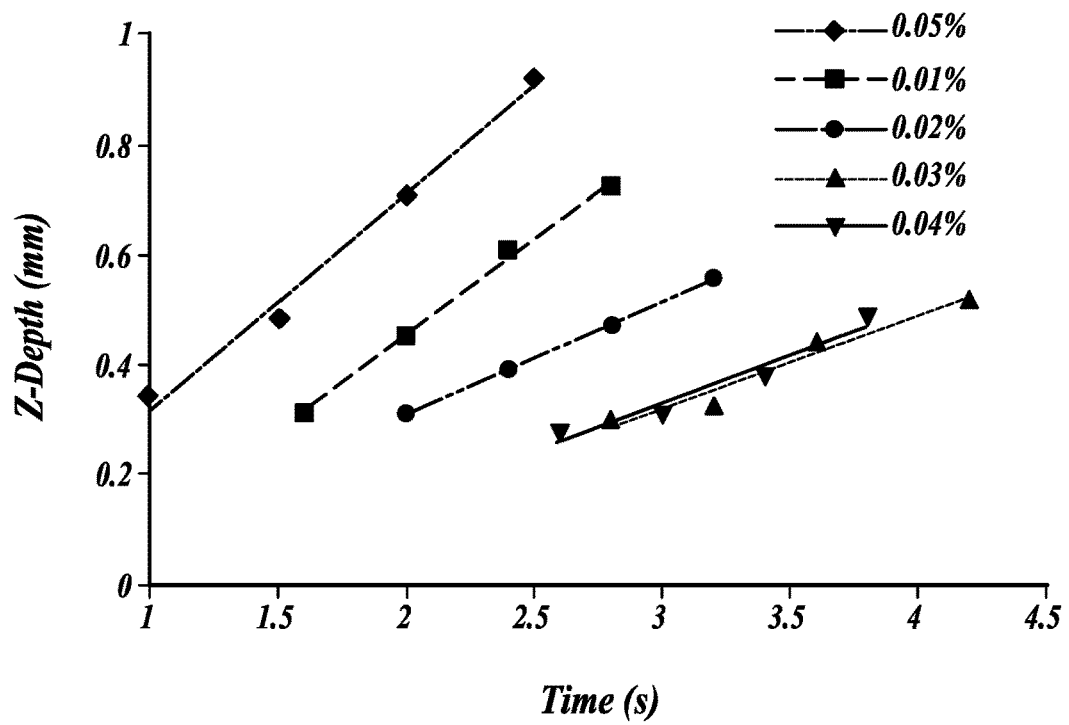
Figure 4A:
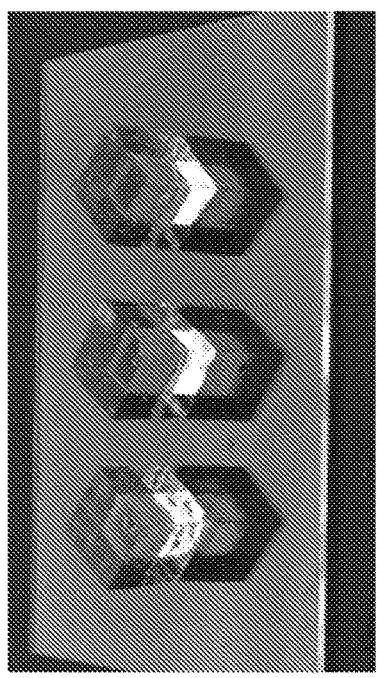
FIGS. 4A and 4B are images of transparent 3D-printed PDMS structures: side and isometric views of solid and hollow cubes.
Figure 4A:
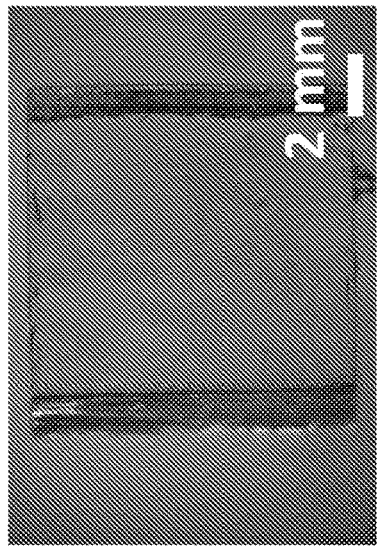
Figure 4A:
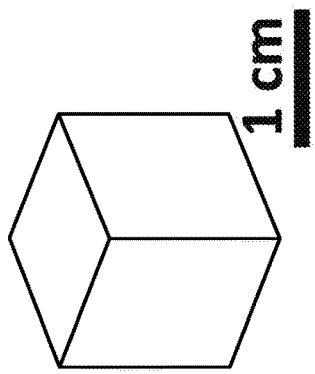
Figure 4B:
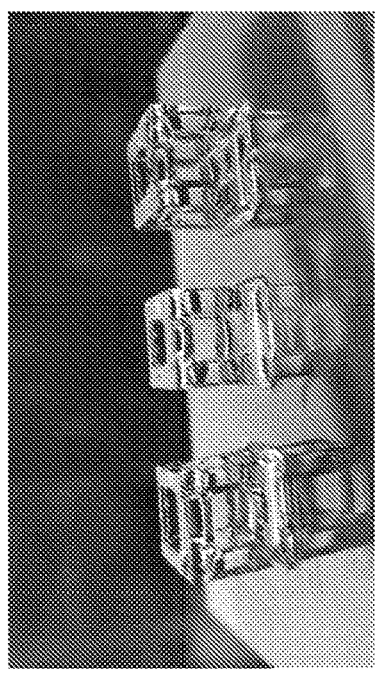
Figure 4B:
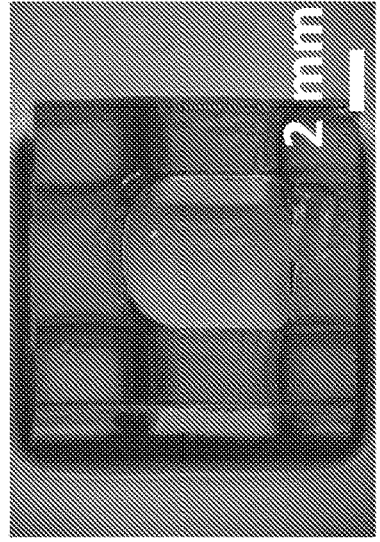
Figure 4B:
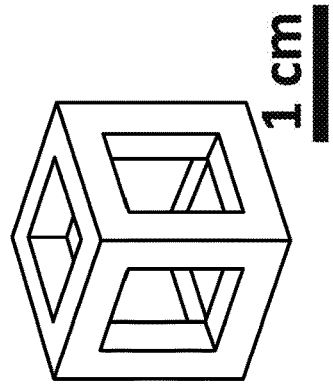

SL 3-D Printed PDMS Structures. Completely transparent SL 3D-printed elastomeric structures were made by building the prints on smooth glass surfaces. See FIGS. 4A and 4B. A high z-resolution is particularly important for SL printed microfluidics because the channels are created flushing out uncured resin from voids that are overlaid by polymerized roofs. The dependence of the penetration depth on ITX concentration for specific TPO-L concentrations was determined and the results are illustrated in FIGS. 3A and 3B.

The ratio of first (terminal polymerizable groups) and second (side-chain polymerizable groups) polysiloxanes (E:S ratio) and the degree of curing to obtain 3D-printed specimens that had similar mechanical properties as Sylgard-184 PDMS (Young's modulus of 1.27 MPa and elongation-at-break of 140%). See FIGS. 2A-2D. The representative optimal mixture had a Young's modulus of 580 kPa and 159% elongation-at-break.

Figure 4C:
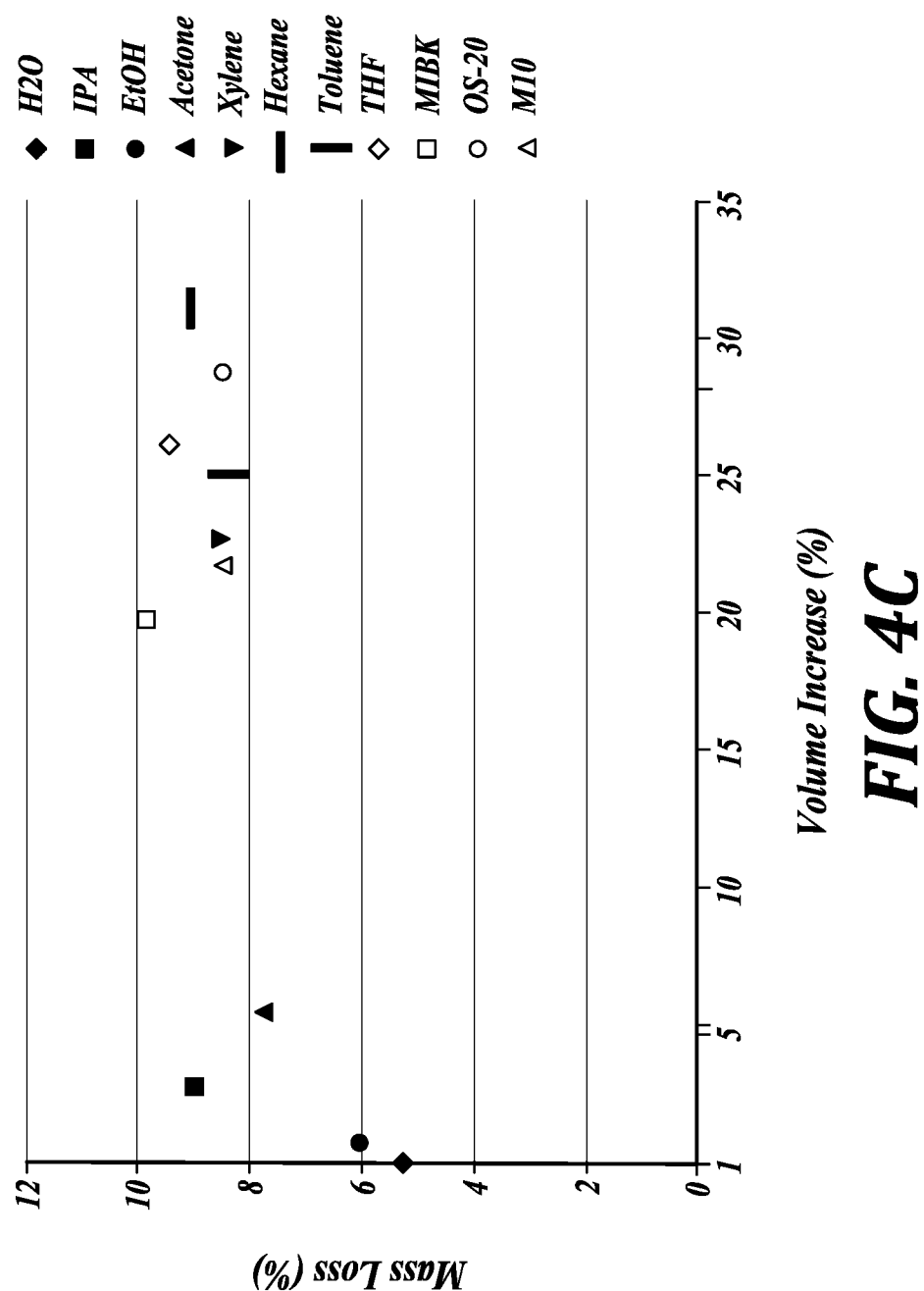
FIG. 4C compares mass loss (%) and volume increase (%) for 3D-printed transparent PDMS cubes extracted with representative solvents in accordance with an embodiment of the method of the invention. Volume increase shows the swelling and mass loss shows the amount of extraction after the solvent is removed and the object dried.
Figure 5A:
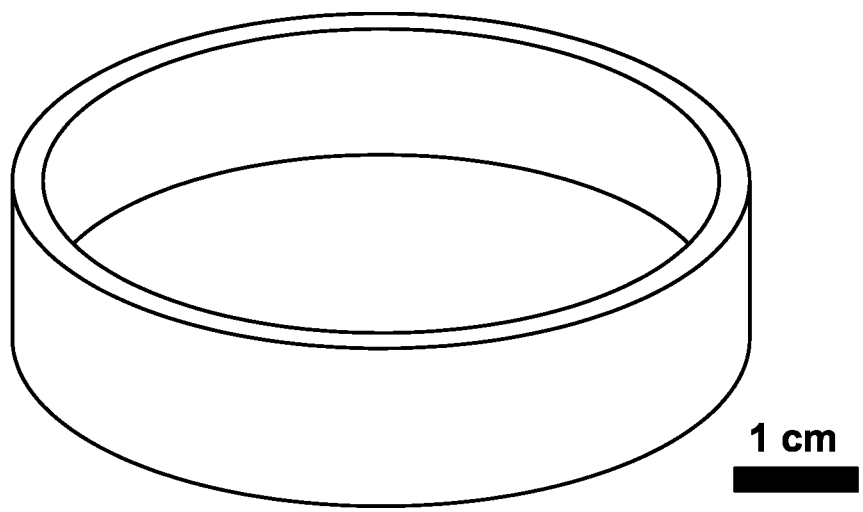
FIGS. 5A-5D illustrate cell culture compatibility of solvent-extracted and post-cured 3D-printed PDMS petri dishes prepared in accordance with the method of the invention: petri dish drawing depicting dimensions (5A); image of PDMS petri dish (5B); image of Chinese hamster ovary (CHO-K1) cells grown on PDMS dishes that have 3D-printed and post-processed (solvent extraction and UV treatment); comparison of live/dead percentage of CHO-K1 cells after 24 hours of culture in extracted 3D-printed PDMS dishes, compared to thermally cured Sylgard 184 molded PDMS dishes (5D).
Figure 5B:
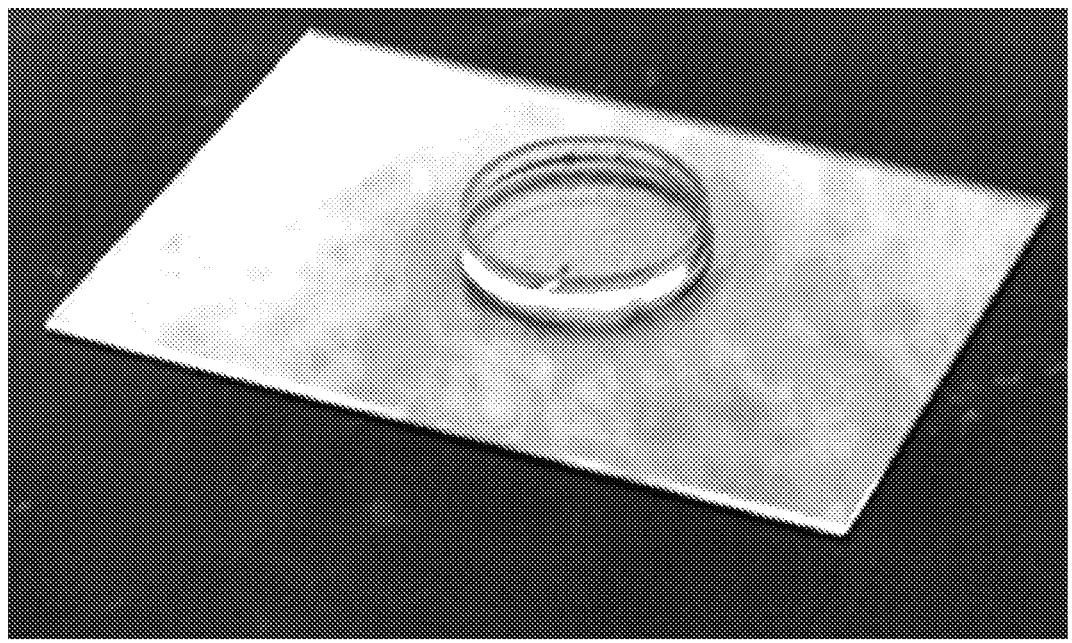
Figure 5C:
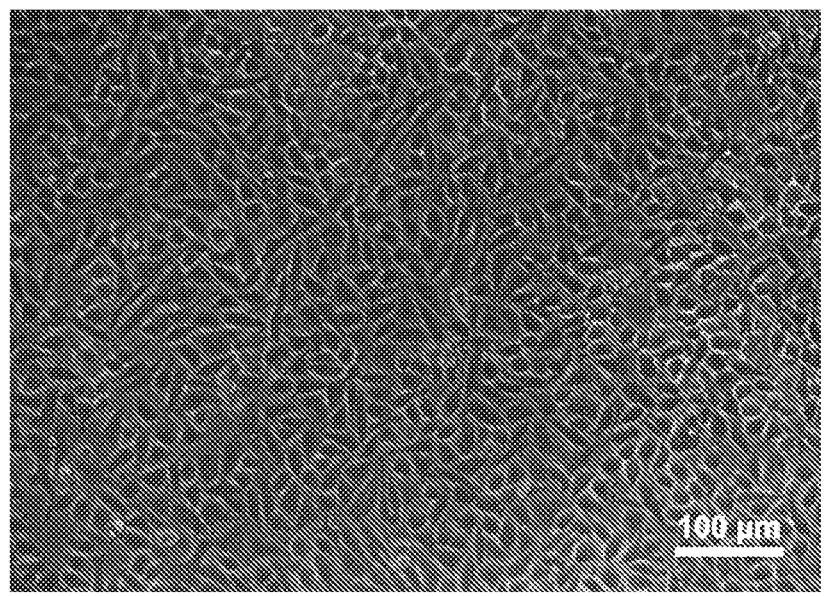
Figure 5D:
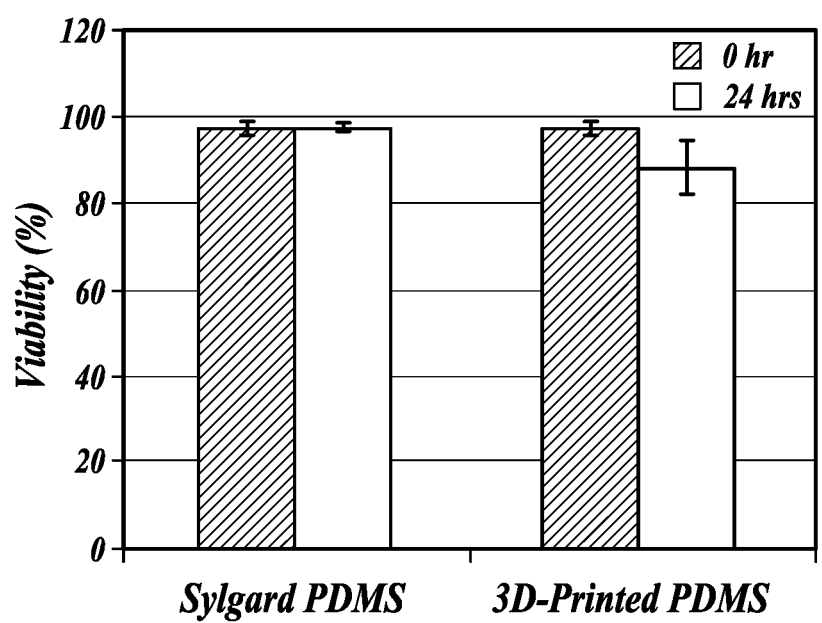
Figure 6A:
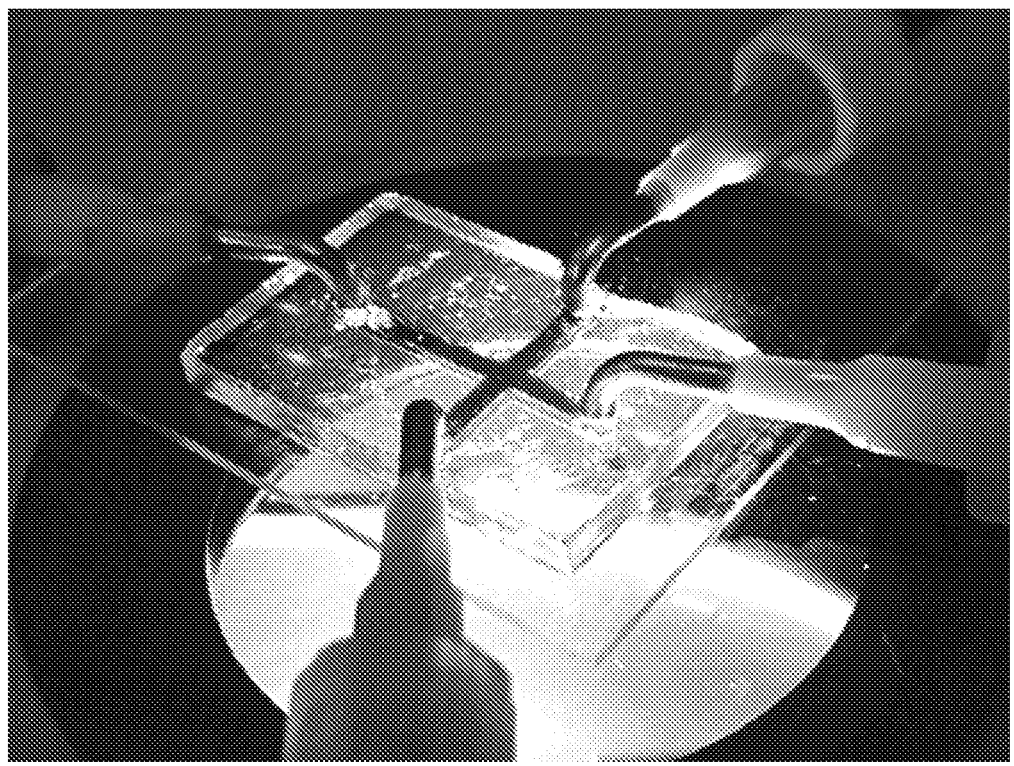
FIGS. 6A-6D illustrate a representative 3D-printed co-planar microfluidic device of the invention showing laminar flow of fluids (containing dyes) with no convective mixing of dyes visible at the interface of the fluids (compare FIGS. 6C and 6D).
Figure 6B:
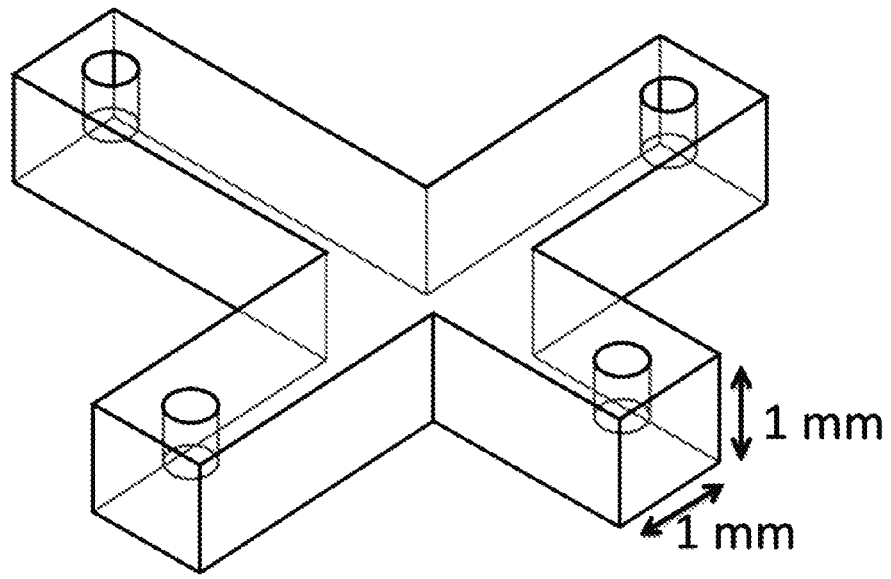
Figure 6C:
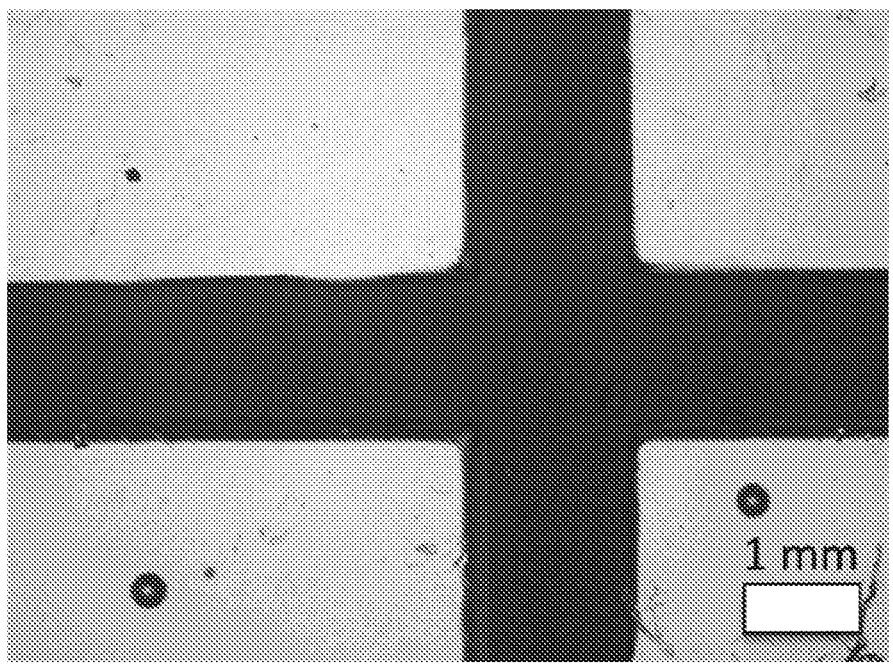
Figure 6D:
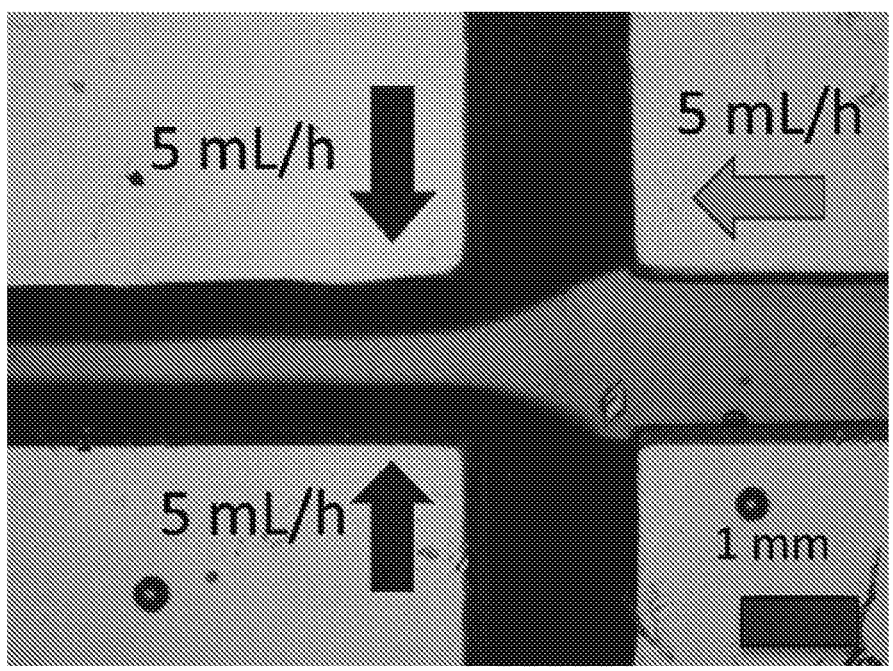

In order to make the 3D-printed material amenable to mammalian cell culture (CHO-K1), partially-cured oligomers were removed by serial extraction with different solvents (see, for example, FIG. 4C). The flushing of the highly viscous resin from the voids introduces a hydrodynamic limit to the maximum achievable resolution of the microchannels. FIG. 5C demonstrates cell culture compatibility of solvent-extracted and post-cured 3D-printed PDMS petri dishes (FIG. 5A shows the petri dish model and FIG. 5B shows the solvent-extracted and post-cured 3D-printed PDMS petri dish.

Resolution in SL 3D-Printed PDMS Structures. A major challenge in the development of a new resin formulation is that modern SL printers are optimized for particular resins, so optimizing resolution with a new resin is not straightforward. Most nominal resolution numbers refer to open-surface features printed with resins of proprietary composition and untested biocompatibility. Custom-built (very expensive) multi-photon optics have been used for about 1 μm resolution SL. In recent years about 500 μm-wide microchannels have been reported with single-photon (very affordable) SL systems. Since all the key SL patents expired in 2014, many SL machines have appeared on the market and nominal resolution is improving almost every month.

The nominal resolution numbers provided by the manufacturer can be misleading. In SL setups based on a digital light projector (DLP), such as a Ilios 3D-Printer, the ultimate XY resolution is given by the DLP's pixel size.

The XY resolution should not be confused with the Z resolution. The Z resolution given by the manufacturer is usually the smallest thickness of the resin layer produced by the Z stepper motor that moves the build plate. In early 2015, desktop machines became available that advertise about 20 μm XY resolution and about 6 μm Z (thickness) resolution or less. The Ilios HD DLP SL printer features a nominal Z resolution of 12.5 μm. Yet microchannels with a cross-section smaller than 500 μm×500 μm are very difficult to achieve with most printers, especially in transparent resins. Prior work has already addressed the diffusion of the reactants and the viscosity of the resin (which must be cleared from the channels after exposure) as factors that might be responsible for some of the loss of resolution typically observed in SL.

SL 3D-Printing with Transparent PDMS. Transparent resins pose an additional challenge for SL 3D-printing. By definition, a transparent material does not absorb visible light. Unfortunately, most SL manufacturers—to cut costs—recently shifted the light source from UV lasers to visible light (405 nm lasers or DLP projectors). Consequently, these visible light systems produce very poor Z resolution because the (transparent) resins do not absorb well at those wavelengths. The manufacturers of transparent resins typically advertise solid prints with surface features (no cavities), or very sparse reticles, which bear little relevance to microfluidic structures. This limitation is key for microfluidics because, if one attempts to build the roof of a microfluidic channel with a poorly absorbing resin, the light readily penetrates through the roof layer and crosslinks the whole channel.

This problem can be analyzed quantitatively. Since the monomer itself is transparent, the photo-initiator alone causes the vast majority of the resin's absorbance (A) in a spectrophotometer, according to the Beer-Lambert law:

$$A = \ln I_o/I = \epsilon cL \quad (1)$$

where $I_o$ and I are the intensity of incident and transmitted light, respectively, $\epsilon$ is the molar extinction coefficient, c is the concentration of the photo-initiator in the resin, and L is the path length. Since c and L are always known during acquisition of a spectrum, measurement of A yields $\epsilon$ (a function of wavelength). The power spectrum of the Vis-DLP lamp shows a poor overlap with the spectrum of the resin's $\epsilon$, which means that the light source is rather inefficient at triggering the reaction.

Transparent resins are more efficiently patterned with a 385 nm LED-based DLP (PRO4500 from Wintech Digital). At 405 nm, TPO-L absorbance is 38% of the absorbance at 385 nm. At 425 nm, TPO-L absorbance is only 1% of the absorbance at 385 nm. From eqn (1), proportionally smaller Z penetration of light occurs at those wavelengths and a Z resolution increase (not counting diffusion effects). The power spectrum of a 385 nm-DLP shows wavelength overlaps with regions of higher light absorbance and is very monochromatic, so it does not overlap with regions of low light absorbance.

A description of stereolithographic 3D-printed PDMS structures formed in accordance with representative methods of the invention are described in Example 1.

It will be appreciated that in certain embodiments, the compositions of the invention "comprise" the recited components and may include other components not recited. In other embodiments, the compositions of the invention "consist essentially of" the recited components and may include other components not recited that do not materially alter the nature of the compositions (e.g., additional components). In other embodiments, the compositions of the invention "consist of" the recited components and do not include any other components.

As used herein, the term "about" refers to ±5 percent of the specified value.

The following examples are provided for the purpose of illustrating, not limiting, the invention.

EXAMPLES

Example 1

Representative Materials and Methods for Making Stereolithographic 3-D Printed PDMS Structures The following is a description of stereolithographic (SL) 3-D printed PDMS structures formed in accordance with representative methods of the invention.

Photocurable PDMS Formulation. A representative PDMS formulation (resin) was prepared by mixing two kinds of silicone methacrylate monomers—a copolymer of dimethylsiloxane and methacryloxypropyl siloxane (2-4% methacryloxypropyl siloxane) and an end-terminated methacryloxypropyl poly(dimethyl siloxane), with a photo-initiator, ethyl (2,4,6-trimethylbenzoyl) phenyl phosphinate (TPO-L), and a photo-sensitizer, isopropyl thioxanthone (ITX).

SL 3D-Printing of PDMS. All SL printing was done with an Ilios HD printer, equipped with a 385 nm UV LED DLP projector. TPO-L has a high absorbance at 385 nm and is soluble in silicone. According to the Beer-Lambert law, the strong absorption of ITX at 385 nm limits the penetration of the projected UV light into the resin, and therefore enables higher z-resolution.

Absorbance Measurements and Calculations

Absorbance measurements of photocurable PDMS formulation were carried out using a NanoDrop 2000c Spectrophotometer (Thermo Scientific). After the measurements, the molar extinction coefficient, which is independent of concentration, was calculated using eqn (1).

Surface treatment. Surface roughness is a critical parameter to obtain high transparency prints. The vat bottom is formed of quartz, a clear material with low UV absorbance, and is coated with a Teflon film. The Teflon film prevents the adhesion of the PDMS structures to the vat bottom while printing. In order to make the prints transparent, we used a glass surface for the vat that contains the resin as well as for the build plate. The build plate glass was treated with 3-(trimethoxysilyl)propyl methacrylate (TMSPMA) (Sigma-Aldrich). The glass slides were cleaned, dried and coated with TMSPMA in vapor phase at 85° C. overnight.

SL 3D-Printing Setup. The 3D printing platform consists of an ILIOS 3D printer with stepper motors with a nominal Z layer resolution of 12.5 µm, controlled by an Arduino board and a digital light projector (DLP). The ILIOS HD Kit was used. The printer consists of a metallic frame that once assembled has the following dimensions: 60 cm (L)×50 cm (W)×120 cm (H). To this frame, a small VAT and build plate from the kit can be easily assembled providing an area of 100 mm×178 mm. An Optoma HD20 HD DLP projector (Vis-DLP) from the kit was mounted to the frame using adaptors from the kit and adjusted its position for optimal focus and performance.

This projector yields a printing area of 56.7 mm×35.4 mm with a resolution of 29.5 µm×32.7 µm (1920 pixels×1080 pixels). Alternatively, we used another projector, 385 nm LED DLP projector, based on Texas Instruments' DLP4500 chipset, the Wintech PRO4500 (385 nm-DLP). To mount this projector, we removed the Vis-DLP and mounted the 385 nm-DLP to the same adaptors by using an inexpensive custom-made 3D-printed intermediate adaptor. The 385 nm-DLP provides a printing area of 65.6 mm×41 mm with a resolution of 51.2 µm×51.2 µm (1280 pixels×800 pixels). Other electronics such as HT Stepper Motors and Arduino board were included in the kit and were easily assembled to the frame. Arduino allows the communication between the Ilios electronics (i.e., stepper motors) through USB to a computer.

3D-Printing Software. All objects were designed with Autodesk Inventor® and saved in their final form in STL format. Creative Workshop® software was used to slice the objects and convert them into an image sequence. The whole 3D printing process was controlled by custom-made control software based on Matlab (Gcode) to control the Arduino Board and the DLP projectors. This software allows us to precisely control for each layer parameters such as intensity, times of exposure and thickness layer.

3D-Printing Procedure. The photocurable PDMS resin was poured_into the vat and a glass slide was "glued" to the build plate by coating one side with uncured resin and briefly exposing with UV light using a broadband UV lamp (B-100 A, UVP), or was attached to the build plate with a double sided tape. (This procedure allows for easy removal of the glass slide with a scraper at the end of the printing process;

mechanical methods for attaching the glass slide to the build plate should be more practical in the long term.) The build plate was then lowered until it touched the vat surface. In short, the printing process was carried as follows: the DLP projects the first slice of the object for a predetermined amount of time, the build plate stage rises and then lowers, the DLP projects the second slice, the build plate stage rises again, and the process continues until the whole object is printed. Then the object is removed from the build plate, rinsed with solvents and cleaned with pressurized air and solvents. The print is then kept in isopropyl alcohol and exposed for an additional 2 h to UV light using a UV gel box (high performance trans-illuminator TFL-40, UVP) to ensure that all the resin is cured; when prints are used for cell culture, precautions are taken and over-curing process is extended overnight (the 2 h period was insufficient and resulted in some cell death, presumably due to leaching of cytotoxic uncured material). If the object contains a microchannel, the UV exposure is performed under perfusion with solvents to remove uncured material from inside the microchannel.

While illustrative embodiments have been illustrated and described, it will be appreciated that various changes can be made therein without departing from the spirit and scope of the invention.

The embodiments of the invention in which an exclusive property or privilege is claimed are defined as follows:

1. A poly(siloxane) formulation, comprising:
   (a) a first polymerizable poly(siloxane) having a first terminus and a second terminus, each terminus comprising a terminal polymerizable group;
   (b) a second polymerizable poly(siloxane) comprising repeating units, at least some of the repeating units having a side-chain polymerizable group;
   (c) a photo-initiator; and
   (d) a photo-sensitizer,
   wherein the photo-initiator is ethyl (2,4,6-trimethylbenzoyl) phenyl phosphinate (TPO-L) and the photo-sensitizer is isopropyl thioxanthone (ITX).

2. The poly(siloxane) formulation of claim 1 further comprising an ultraviolet light absorber.

3. The poly(siloxane) formulation of claim 1, wherein the poly(siloxane) is a poly(dimethylsiloxane).

4. The poly(siloxane) formulation of claim 1, wherein the first polymerizable poly(siloxane) is a poly(dimethylsiloxane).

5. The poly(siloxane) formulation of claim 1, wherein the terminal polymerizable group is reactive toward free radical polymerization.

6. The poly(siloxane) formulation of claim 1, wherein the terminal polymerizable group is independently selected from an acrylate, a methacrylate, an acrylamide, or a vinyl group.

7. The poly(siloxane) formulation of claim 1, wherein the first polymerizable poly(siloxane) is methacryloxypropyl poly(dimethylsiloxane).

8. The poly(siloxane) formulation of claim 1, wherein the second polymerizable poly(siloxane) is a poly(dimethylsiloxane).

9. The poly(siloxane) formulation of claim 1, wherein the side-chain polymerizable group is reactive toward free radical polymerization.

10. The poly(siloxane) formulation of claim 1, wherein the side-chain polymerizable group is independently selected from an acrylate, a methacrylate, an acrylamide, or a thiol group.

11. The poly(siloxane) formulation of claim 1, wherein the second polymerizable poly(siloxane) is a copolymer of dimethyl siloxane and methacryloxypropyl dimethyl siloxane.

12. The poly(siloxane) formulation of claim 2, wherein the ultraviolet light absorber has an absorbance in the range from about 300 nm to about 420 nm (UV-A range).

13. A method for stereolithographic 3-D printing an object, comprising:
   (a) distributing a poly(siloxane) formulation of claim 1 in a vessel having an XY surface to provide a resin contained in the vessel, wherein the resin is coextensive with the surface;
   (b) positioning a build-surface on which the object is to be printed at a distance Z from the bottom of the vessel;
   (c) selectively illuminating a first portion of the resin through positioning of a light source relative to the build-surface to effect photopolymerization of the first portion of the resin to provide a first photocured layer adjacent to the surface, wherein the first photocured layer has a thickness defined by the distance between the build-surface and the bottom of the vessel;
   (d) adjusting the relative position of the build-surface and the light source and selectively illuminate a second portion of the resin adjacent to the first photocured layer to provide a second photocured layer, wherein the first and second photocured layers form an integral photocured layer; and
   (e) repeating steps (c) and (d) until the object is built.

14. In a method for stereolithographic 3-D printing an object from a photocurable resin, the improvement being the use of a poly(siloxane) formulation of claim 1 as the photocurable resin.

15. The method of claim 13 further comprising washing the built object to remove uncured resin that is residual in the built object.

16. The method of claim 15, wherein washing the built object to remove uncured resin reveals voids in the built object resulting from select illumination and photopolymerization.

17. The method of claim 15, wherein washing the built object comprises serial washing with solvents with increasing polarity.

18. A stereolithographically 3D-printed structure, comprising a poly(siloxane) network prepared by photocuring the poly(siloxane) formulation of claim 1.

19. The structure of claim 18, wherein the structure is a solid structure.

20. The structure of claim 18, wherein the structure is a microfluidic device.

* * * * *